US007545193B2

(12) United States Patent
Rhee et al.

(10) Patent No.: US 7,545,193 B2
(45) Date of Patent: Jun. 9, 2009

(54) VOLTAGE-CONTROLLED DELAY CIRCUIT USING SECOND-ORDER PHASE INTERPOLATION

(75) Inventors: Woogeun Rhee, Norwood, NJ (US); Daniel Friedman, Sleepy Hollow, NY (US); Mehmet Soyuer, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 914 days.

(21) Appl. No.: 10/697,751

(22) Filed: Oct. 30, 2003

(65) Prior Publication Data

US 2005/0093595 A1 May 5, 2005

(51) Int. Cl.
 *H03H 11/16* (2006.01)
(52) U.S. Cl. .................... 327/237; 327/256; 327/158
(58) Field of Classification Search ............... 327/149, 327/153, 150, 158, 159, 122, 231, 161, 256, 327/257; 331/17
See application file for complete search history.

(56) References Cited

U.S. PATENT DOCUMENTS

| | | | | |
|---|---|---|---|---|
| 5,864,246 A * | 1/1999 | Anderson | ............... | 327/122 |
| 6,122,336 A * | 9/2000 | Anderson | ............... | 375/371 |
| 6,133,773 A * | 10/2000 | Garlepp et al. | ............... | 327/247 |
| 6,295,328 B1 * | 9/2001 | Kim et al. | ............... | 375/376 |
| 6,346,839 B1 * | 2/2002 | Mnich | ............... | 327/158 |
| 6,922,091 B2 * | 7/2005 | Kizer | ............... | 327/156 |

OTHER PUBLICATIONS

S. Lee et al., "A 5 Gb/s 0.25 μm CMOS Jitter-Tolerant Variable-Interval Oversampling Clock/Data Recovery Circuit," ISSCC, Session 15, Gigabit Communications, pp. 463-465, Feb. 2002.
J. Savoj et al., "A 10-Gb/s CMOS Clock and Data Recovery Circuit with a Half-Rate Linear Phase Detector," IEEE Journal of Solid-State Circuits, vol. 36, No. 5, pp. 761-767, May 2001.
W. Rhee, "A Low Power, Wide Linear-Range CMOS Voltage-Controlled Oscillator," Proc. of IEEE, pp. II-85-II-88, May 1998.

* cited by examiner

*Primary Examiner*—Long Nguyen
*Assistant Examiner*—Ryan C Jager
(74) *Attorney, Agent, or Firm*—Anne V. Dougherty; Ryan, Mason & Lewis, LLP

(57) ABSTRACT

Phase interpolation techniques for voltage-controlled delay line (VCDL) implementation are provided. The techniques of the invention may employ a second-order phase interpolation topology to improve tuning range performance of the VCDL over process and temperature variation. In one aspect of the invention, the technique may use a complementary input signal to set an absolute 180-degree phase reference. As a result, the maximum tuning range of 180 degrees can be achieved regardless of internal delay variation.

15 Claims, 5 Drawing Sheets

US 7,545,193 B2

VOLTAGE-CONTROLLED DELAY CIRCUIT USING SECOND-ORDER PHASE INTERPOLATION

FIELD OF THE INVENTION

The present invention generally relates to delay elements and, more particularly, to voltage-controlled delay circuits using second-order phase interpolation.

BACKGROUND OF THE INVENTION

A variable delay element has proven to be a useful circuit element in many applications. For instance, a delay element is one of the key functional blocks in a delay-locked loop (DLL) circuit. A DLL circuit typically synchronizes an internal clock with an incoming clock.

The variable delay element is also used in clock-and-data recovery (CDR) systems. In CDR systems, a clock and data are recovered from a single high-speed serial stream of non-return-to-zero (NRZ) data.

SUMMARY OF THE INVENTION

Principles of the present invention provide a phase interpolation technique for voltage-controlled delay line (VCDL) implementation. The techniques of the invention may employ a second-order phase interpolation topology to improve tuning range performance of the VCDL over process and temperature variation. In one aspect of the invention, the technique may use a complementary input signal to set an absolute 180-degree phase reference. As a result, the maximum (complete or full) tuning range of 180 degrees can be achieved regardless of internal delay variation. Such techniques may be employed in various circuits and systems, e.g., a delay-locked loop (DLL) circuit or a clock-and-data recovery (CDR) system.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1A:
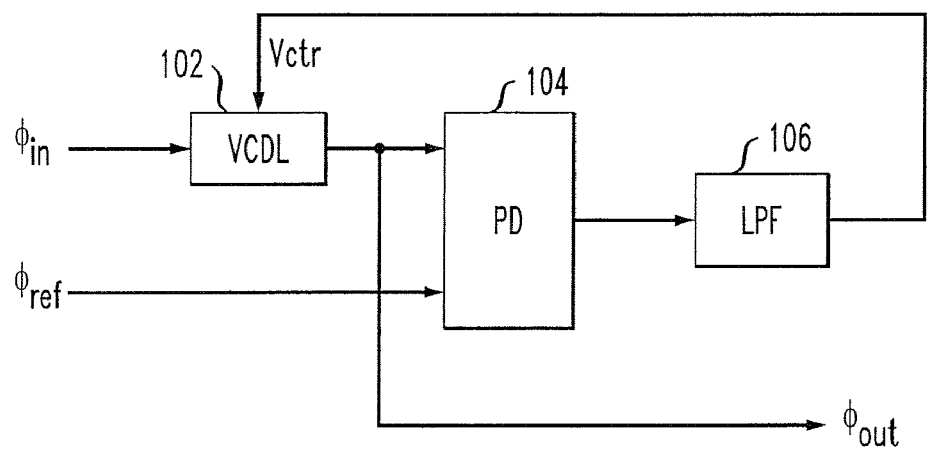
FIG. 1A is a block diagram illustrating a delay-locked loop circuit.

Referring initially to FIG. 1A, a block diagram illustrates a delay-locked loop (DLL) circuit. As shown, DLL circuit 100 includes a voltage-controlled delay line (VCDL) 102, a phase detector (PD) 104 and a loop filter (LPF) 106. PD 104 compares the timing difference between a reference clock edge and a clock edge from VCDL 102. PD 104 also generates an error voltage for VCDL 102 to adjust the phase shift (i.e., control voltage Vctr fed back to VCDL 102). The PD 104 is usually accompanied by a charge pump (not shown) in modern integrated circuit design. LPF 106, coupled between the phase detector and the VCDL, rejects high frequency noise. The feedback operation forces the internal clock edge to be aligned to the incoming clock edge.

Figure 1B:
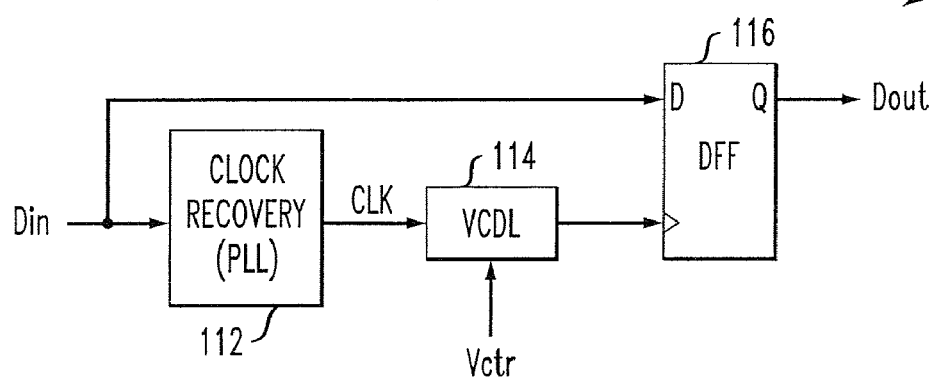
FIG. 1B is a block diagram illustrating use of a delay line to achieve optimum clock edge location for data sampling.

Referring now to FIG. 1B, a block diagram illustrates use of a delay line to achieve optimum clock edge location for data sampling. Such an implementation is disclosed in S. Lee et al., "A 5 Gb/s 0.25 µm CMOS Jitter-tolerant Variable-interval Oversampling Clock/Data Recovery Circuit," ISSCC Dig. Tech. Papers, February 2002, the disclosure of which is incorporated by reference herein. As shown, variable delay circuit 110 includes a clock recovery circuit (such as a phase-locked loop or PLL) 112, a voltage-controlled delay line (VCDL) 114 and a D-type flip flop (DFF) 116. This variable delay circuit may be used in clock-and-data recovery (CDR) systems, in which a clock (CLK) and data (Dout) are recovered from a single high-speed serial stream of non-return-to-zero (NRZ) data.

The control input of the VCDL is based on the system feedback to maximize the data eye opening. As is known, in data communications, a clock signal can not be ideal and thus its period changes. This is referred to as timing jitter. When the data is retimed by the clock signal, the timing jitter of the clock will cause timing jitter during the rising and falling transition of the data. If the amount of jitter is large, the open area between rising and falling data edges will be reduced. This is referred to as a reduced data eye opening. Thus, it is beneficial to try to maximize the data eye opening.

Figure 2A:
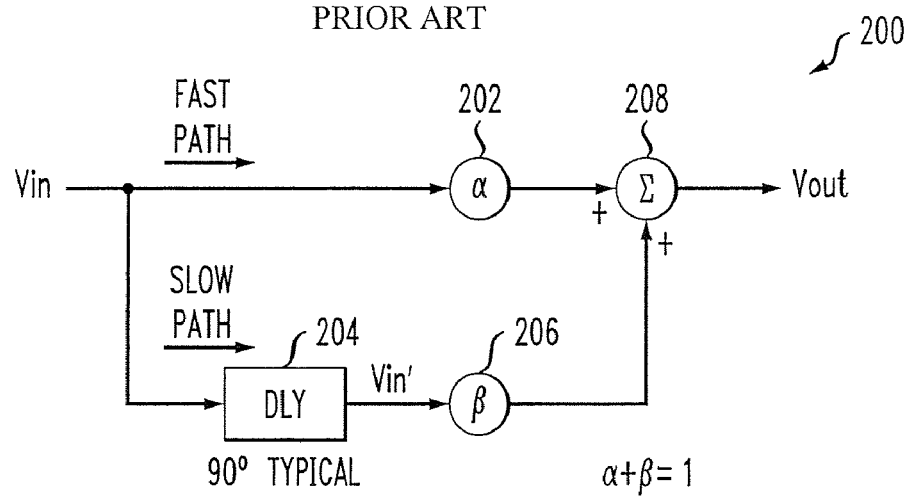
FIG. 2A is a block diagram illustrating a voltage-controlled delay line using two-stage cascaded phase interpolation.

Referring now to FIG. 2A, a block diagram illustrates a voltage-controlled delay line using two-stage cascaded phase interpolation. Such an implementation is disclosed in J. Savoj et al., "A 10-Gb/s CMOS Clock and Data Recovery Circuit with a Half-rate Linear Phase Detector," IEEE J. Solid-State Circuits, vol. 36, pp. 761-767, May 2001, the disclosure of which is incorporated by reference herein.

As shown, voltage-controlled delay line 200 includes a first weighting unit 202 for introducing weight α, a delay line (DLY) 204, a second weighting unit 206 for introducing weight β, and a summer 208. An input signal (Vin) goes through two paths. One path is a fast path without a delay line and the other is a slow path with delay line 204. The signals from both paths are then respectively weighted (weight α in the fast path and weight β in the slow path, where α+β=1) and then summed via summer 208 to achieve phase interpolation.

Delay line 204 in the slow path is typically designed to have a delay of 90 degrees of the input clock period. The phase interpolation technique depicted in FIG. 2A is often used in high frequency applications since the minimum and maximum delays can be relatively well defined in high frequencies compared to voltage-slewing methods, see, e.g., W. Rhee, "A Low-power Wide Linear-range CMOS Voltage-controlled Oscillator," Proc. Of ISCAS, May 1998, the disclosure of which is incorporated by reference herein. The technique can also directly accommodate differential control inputs, which is desirable for good circuit noise performance.

Figure 2B:
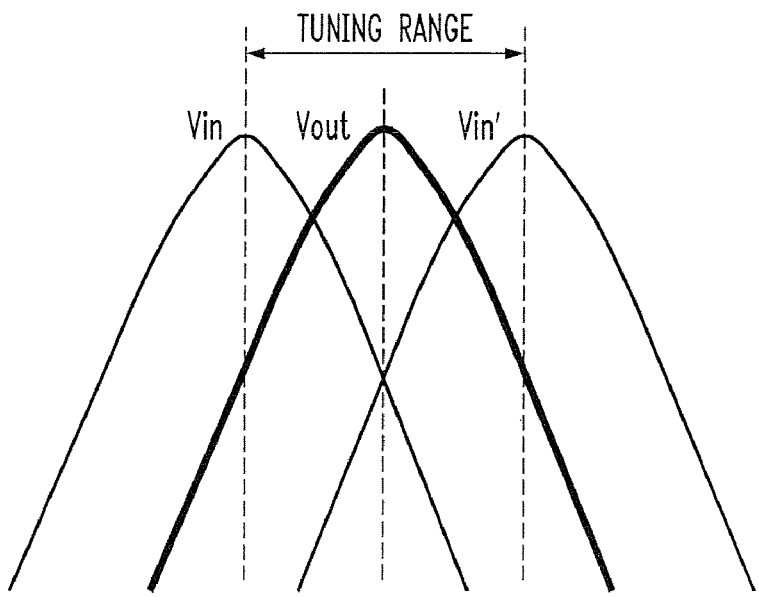
FIG. 2B is a graphical diagram illustrating a tuning range associated with the voltage-controlled delay line of FIG. 2A.

In general, on-chip delay circuits suffer from a wide variation of the free-running delay over process and temperature variation. Since the maximum delay is mainly determined by the delay line in the slow signal path in FIG. 2A, a wide variation of the VCDL tuning range can occur. Such a tuning range is illustrated in FIG. 2B. In a DLL, such a wide delay variation makes it difficult to achieve low noise performance, since the technique requires a large VCDL gain to meet the tuning range over process and temperature variation.

The present invention provides a second-order phase interpolation topology for voltage-controlled delay elements with improved tuning range performance over process and temperature variation.

Figure 3A:
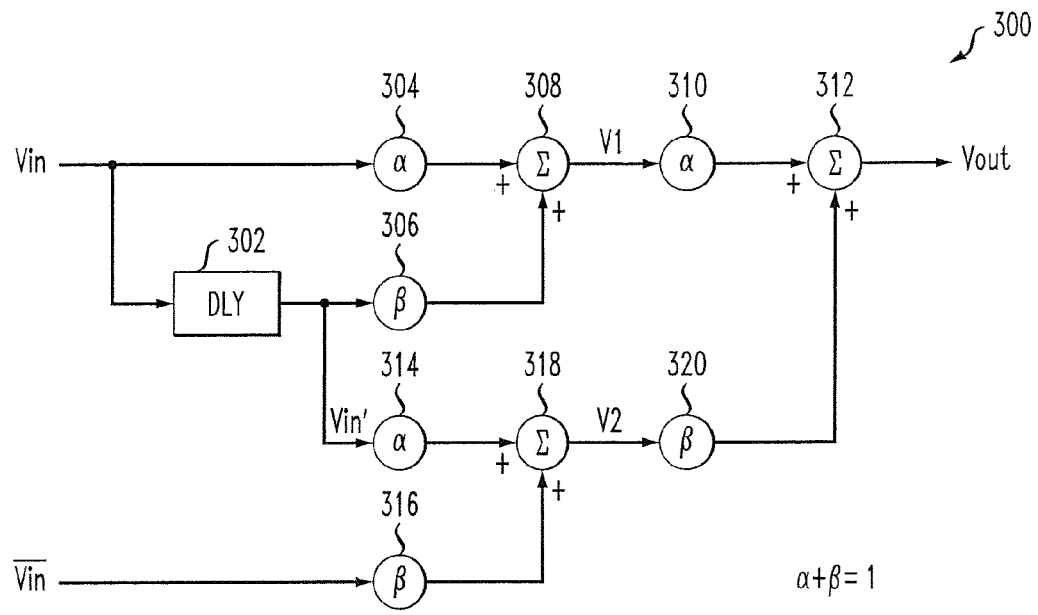
FIG. 3A is a block diagram illustrating a voltage-controlled delay line using second-order phase interpolation, according to an embodiment of the present invention.

Referring now to FIG. 3A, a block diagram illustrates a voltage-controlled delay line using second-order phase interpolation, according to an embodiment of the present invention. As shown, voltage-controlled delay line 300 includes a delay line (DLY) 302, a first weighting unit 304 for introducing weight $\alpha$, a second weighting unit 306 for introducing weight $\beta$, a first summer 308, a third weighting unit 310 for introducing weight $\alpha$, a second summer 312, a fourth weighting unit 314 for introducing weight $\alpha$, a fifth weighting unit 316 for introducing weight $\beta$, a third summer 318, and a sixth weighting unit 320 for introducing weight $\beta$. It is to be appreciated that $\alpha+\beta=1$. For example, $\alpha$ may equal 0.3 and $\beta$ may equal 0.7. However, $\alpha$ and $\beta$ may be any number between 0 and 1 such that $\alpha+\beta=1$. Further, it may be illustratively assumed in FIG. 3A that every $\alpha$ is the same value, and every $\beta$ is the same value.

An input signal (Vin) is weighted ($\alpha$) by unit 304, and also delayed by delay line 302 (to generate signal Vin') and weighted ($\beta$) by unit 306. The respective outputs of units 304 and 306 are summed by summer 308 to generate signal V1. The output of summer 308 is weighted ($\alpha$) by unit 310. Also, the output of delay line 302 is weighted ($\alpha$) by unit 314. The complement of the input signal is weighted ($\beta$) by unit 316. The respective outputs of units 314 and 316 are summed by summer 318 to generate signal V2. The output of summer 318 is weighted ($\beta$) by unit 320. The respective outputs of units 310 and 320 are summed by summer 312. The output of summer 312 is the output signal (Vout) of voltage-controlled delay line 300.

Thus, as shown in FIG. 3A, voltage-controlled delay line 300 implements a second-order phase interpolation topology. The tuning range of the second-order phase interpolation VCDL in the nominal condition is the same as that of the 2-stage cascaded VCDL. However, the inventive technique employs the complementary input to generate an absolute 180-degree phase reference. In differential circuits (as are typically used in high-frequency designs), the complementary input can be obtained without having additional circuits, i.e., the complementary signal is always available. As a result, the tuning range of 180-degrees can be achieved regardless of delay variation of the delay cell (element 302) shown in FIG. 3A, and the maximum delay of 180-degrees of input clock period is guaranteed over process and temperature variations.

Figure 3B:
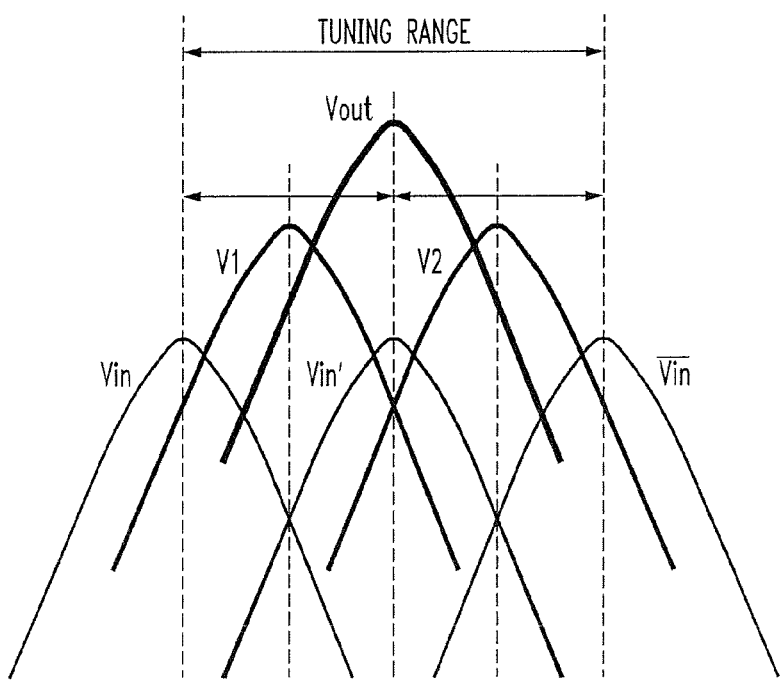
FIG. 3B is a graphical diagram illustrating a tuning range associated with the voltage-controlled delay line of FIG. 3A.

The tuning range associated with the VCDL 300 is illustrated in FIG. 3B. As depicted, the bottom middle waveform is Vin', which is the delayed waveform of Vin. V1 is generated by phase interpolation (as illustrated in FIG. 3A) using Vin and Vin', and V2 is generated by phase interpolation (as illustrated in FIG. 3A) using Vin' and the complement of Vin. Vout is generated by phase interpolation using V1 and V2.

Figure 4:
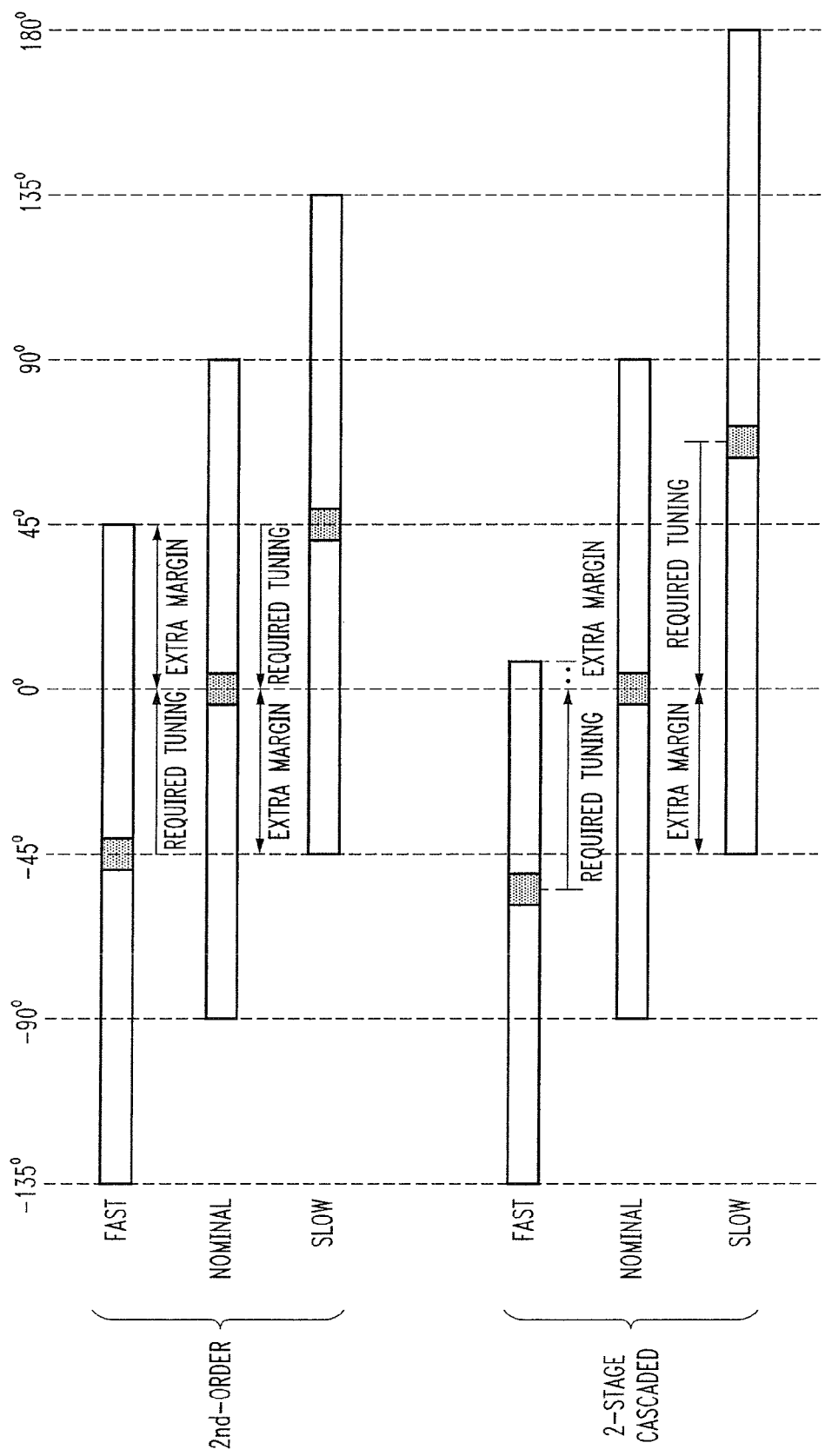
FIG. 4 is a diagram illustrating a tuning range comparison between second-order phase interpolation and two-stage cascaded phase interpolation.

Referring now to FIG. 4, a diagram illustrates a tuning range comparison between second-order phase interpolation (FIG. 3A) and two-stage cascaded phase interpolation (FIG. 2A). As illustrated, the second-order phase interpolation technique advantageously offers less delay variation and more design margin between slow and fast process corners.

In FIG. 4, target delay is set to zero degrees (or 360 degrees). However, after integrated circuit (IC) fabrication, the IC may exhibit faster or slower performance than expected (targeted). When performance is faster than expected, we call performance "Fast." Similarly, when performance is slower than expected, we call performance "Slow." "Nominal" refers to the condition when performance is as expected or targeted.

Thus, for example, the "Fast" 2nd-order delay line in FIG. 4 achieves delay of −45 degrees (expected to be zero degrees in accordance with nominal performance). By changing the control voltage, we can tune the delay to zero degrees as desired. If the circuit has a tuning range of ±degrees, as an extreme example, the circuit does not achieve zero degrees with the control voltage (i.e., −45+30 is still −15). Therefore, having enough tuning range is important to achieve target delay requirement (extra margin). The principles of the present invention provide such an improved tuning range.

Figure 5:
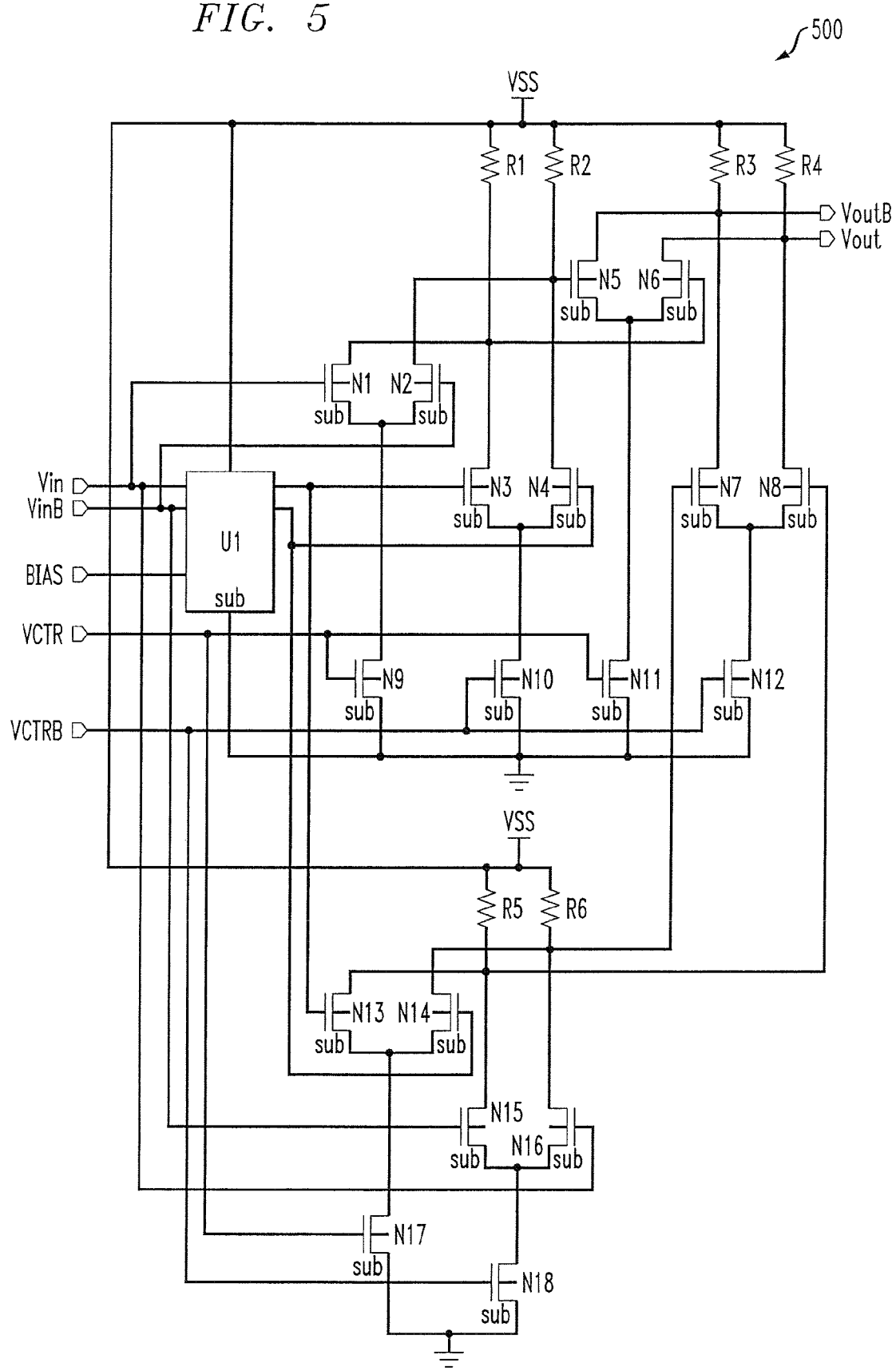
FIG. 5 is a schematic diagram illustrating a voltage-controlled delay line using second-order phase interpolation, according to an embodiment of the present invention.

FIG. 5 is a schematic diagram illustrating a voltage-controlled delay line using second-order phase interpolation, according to an embodiment of the present invention. It is to be appreciated that voltage-controlled delay line 500 implements the functional blocks of FIG. 3A. However, one skilled in the art will realize other ways to implement the functionality of FIG. 3A.

The input signal names, from top to bottom on the left-hand side of FIG. 5, are VIN, VINB, BIAS, VCTR and VCTRB. The differential pair of (VIN, VINB) is equivalent to Vin in FIG. 3A. The differential pair of (VINB, VIN) is equivalent to the complement of Vin in FIG. 3A. BIAS is for setting the analog bias current. The differential pair of (VCTR, VCTRB) is a control voltage used to set $\alpha$ and $\beta$ in FIG. 3A. The output signal names, from top to bottom on the right-hand side of FIG. 5, are VOUT and VOUTB. The differential pair of (VOUT, VOUTB) is equivalent to Vout in FIG. 3A. N1-N18 are NMOSFET transistors, and R1-R4 are resistors. U1 is used to implement DLY in FIG. 3A. U1, N1, N2, N3, N4, N9, N10, R1 and R2 are used to implement elements 302, 304, 306 and 308 in FIG. 3A to generate V1. U1, N13, N14, N15, N16, N17, N18, R5 and R6 are used to implement elements 302, 314, 316 and 318 in FIG. 3A to generate V2. N5, N6, N7, N8, N11, N12, R3 and R4 are used to implement elements 310, 320 and 312 in FIG. 3A to generate Vout.

Advantageously, the present invention employs three summing blocks and one delay cell, while two conventional delay circuits would require two summing blocks and two delay cells. Further, a VCDL using the inventive technique enhances delay-range performance without consuming additional power.

It is to be appreciated that the voltage-controlled delay line described above may be implemented in accordance with a processor for controlling and performing the various operations described herein, a memory, and an input/output interface. It is to be appreciated that the term "processor" as used herein is intended to include any processing device, such as, for example, one that includes a CPU (central processing unit) and/or other forms of processing circuitry. For example, the processor may be a digital signal processor, as is known in the art. Also the term "processor" may refer to more than one individual processor. The term "memory" as used herein is intended to include memory associated with a processor or CPU, such as, for example, RAM, ROM, a fixed memory device (e.g., hard drive), a removable memory device (e.g., diskette), a flash memory, etc. In addition, the phrase "input/output interface" as used herein is intended to include, for example, one or more mechanisms for inputting data to the processing unit, and one or more mechanisms for providing results associated with the processing unit.

Accordingly, computer software including instructions or code for performing the methodologies of the invention, as described herein, may be stored in one or more of the associated memory devices (e.g., ROM, fixed or removable memory) and, when ready to be utilized, loaded in part or in whole (e.g., into RAM) and executed by a CPU.

In any case, it should be understood that the components illustrated in the voltage-controlled delay line embodiments described above may be implemented in various forms of hardware, software, or combinations thereof, e.g., one or more digital signal processors with associated memory, application specific integrated circuit(s), functional circuitry, one or more appropriately programmed general purpose digital computers with associated memory, etc. Given the teachings of the invention provided herein, one of ordinary skill in the related art will be able to contemplate other implementations of the components of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A voltage-controlled delay line, comprising:
   a delay element; and
   a phase interpolation circuit coupled to the delay element;
   wherein the delay element and the phase interpolation circuit are operative to: (i) obtain an input signal and a complement of the input signal; and (ii) use the input signal and the complement of the input signal to perform a phase interpolation process so as to realize a delay complete delay tuning range with respect to the input signal;
   further wherein the delay element generates a delay signal from the input signal, the delay signal being a delayed form of the input signal, and the phase interpolation circuit generates a first signal by performing a first order interpolation using the input signal and the delay signal, generates a second signal by performing a first order interpolation using the complement of the input signal and the delay signal, and generates a voltage-controlled delay line output signal by performing a second order interpolation using the first signal and the second signal.

2. The voltage-controlled delay line of claim 1, wherein the phase interpolation process is a second-order phase interpolation process.

3. The voltage-controlled delay line of claim 1, wherein the delay tuning range is equivalent to 180 degrees of a period of the input signal.

4. The voltage-controlled delay line of claim 1, wherein the delay tuning range is guaranteed over a process variation.

5. The voltage-controlled delay line of claim 1, wherein the delay tuning range is guaranteed over a temperature variation.

6. The voltage-controlled delay line of claim 1, wherein the complement of the input signal is used to generate an absolute 180-degree phase reference.

7. A delay-locked loop circuit, comprising:
   a voltage-controlled delay line comprising: (i) a delay element; and (ii) a phase interpolation circuit coupled to the delay element; wherein the delay element and the phase interpolation circuit are operative to obtain an input signal and a complement of the input signal; and use the input signal and the complement of the input signal to perform a phase interpolation process so as to realize a complete delay tuning range with respect to the input signal, further wherein the delay element generates a delay signal from the input signal, the delay signal being a delayed form of the input signal, and the phase interpolation circuit generates a first signal by performing a first order interpolation using the input signal and the delay signal, generates a second signal by performing a first order interpolation using the complement of the input signal and the delay signal, and generates a voltage-controlled delay line output signal by performing a second order interpolation using the first signal and the second signal; and
   a phase detector coupled to the voltage-controlled delay line for generating an error signal for adjusting a phase shift associated with the voltage-controlled delay line, the phase shift being indicated by the voltage-controlled delay line output signal.

8. A clock and data recovery system, comprising:
   a clock recovery circuit for recovering a clock signal;
   a voltage-controlled delay line, coupled to the clock recovery circuit, comprising: (i) a delay element; and (ii) a phase interpolation circuit coupled to the delay element; wherein the delay element and the phase interpolation circuit are operative to obtain the clock signal and a complement of the clock signal; and use the clock signal and the complement of the clock signal to perform a phase interpolation process so as to realize a complete delay tuning range with respect to the clock signal, further wherein the delay element generates a delay clock signal from the clock signal, the delay clock signal being a delayed form of the clock signal, and the phase interpolation circuit generates a first signal by performing a first order interpolation using the clock signal and the delay clock signal, generates a second signal by performing a first order interpolation using the complement of the clock and the delay clock signal, and generates a voltage-controlled delay line output signal by performing a second order interpolation using the first signal and the second signal; and
   a data recovery circuit coupled to the voltage-controlled delay line for recovering data in accordance with a clock signal received from the voltage-controlled delay line, the clock signal being the voltage-controlled delay line output signal.

9. A method for delaying an input signal, comprising the steps of:
   obtaining an input signal and a complement of the input signal; and
   using the input signal and the complement of the input signal to perform a phase interpolation process so as to realize a complete delay tuning range with respect to the input signal;
   wherein the using step further comprises generating a delay signal from the input signal, the delay signal being a delayed form of the input signal, and generating a first signal by performing a first order interpolation using the input signal and the delay signal, generating a second signal by performing a first order interpolation using the complement of the input signal and the delay signal, and generating an output signal by performing a second order interpolation using the first signal and the second signal.

10. The method of claim 9, wherein the phase interpolation process is a second-order phase interpolation process.

11. The method of claim 9, wherein the delay tuning range is equivalent to 180 degrees of a period of the input signal.

12. The method of claim 9, wherein the delay tuning range is guaranteed over a process variation.

13. The method of claim 9, wherein the delay tuning range is guaranteed over a temperature variation.

14. The method of claim 9, wherein the complement of the input signal is used to generate an absolute 180-degree phase reference.

15. Apparatus for delaying an input signal, comprising:
a memory; and
at least one processor coupled to the memory and operative to: (i) obtain an input signal and a complement of the input signal; and (ii) use the input signal and the complement of the input signal to perform a phase interpolation process so as to realize a complete delay tuning range with respect to the input signal; wherein the processor generates a delay signal from the input signal, the delay signal being a delayed form of the input signal, generates a first signal by performing a first order interpolation using the input signal and the delay signal, generates a second signal by performing a first order interpolation using the complement of the input signal and the delay signal, and generates an output signal by performing a second order interpolation using the first signal and the second signal.

* * * * *